(12) United States Patent
Wu et al.

(10) Patent No.: US 11,910,535 B2
(45) Date of Patent: Feb. 20, 2024

(54) PRINTED CIRCUIT BOARD STACK STRUCTURE AND MANUFACTURING METHOD THEREOF

(71) Applicant: Unimicron Technology Corp., Taoyuan (TW)

(72) Inventors: Ming-Hao Wu, Taoyuan (TW); Shih-Lian Cheng, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 33 days.

(21) Appl. No.: 17/685,404

(22) Filed: Mar. 3, 2022

(65) Prior Publication Data
US 2023/0240014 A1   Jul. 27, 2023

(30) Foreign Application Priority Data
Jan. 24, 2022   (TW) .................................. 111102825

(51) Int. Cl.
| H05K 1/11 | (2006.01) |
| H05K 1/14 | (2006.01) |
| H05K 1/18 | (2006.01) |
| H05K 3/00 | (2006.01) |
| H05K 3/42 | (2006.01) |

(52) U.S. Cl.
CPC ........... *H05K 3/0094* (2013.01); *H05K 1/111* (2013.01); *H05K 1/141* (2013.01); *H05K 1/144* (2013.01); *H05K 3/429* (2013.01); *H05K 1/181* (2013.01); *H05K 2201/09036* (2013.01); *H05K 2201/09909* (2013.01)

(58) Field of Classification Search
None
See application file for complete search history.

(56) References Cited

U.S. PATENT DOCUMENTS

| 7,321,099 B2 * | 1/2008 | Mishiro ................ H01L 23/562 174/262 |
| 2011/0115083 A1 * | 5/2011 | Zang ..................... H01L 21/563 257/E23.116 |
| 2013/0014982 A1 * | 1/2013 | Segawa .................. H05K 1/142 29/830 |

(Continued)

FOREIGN PATENT DOCUMENTS

| CN | 111052367 | 4/2020 |
| TW | M450822 | 4/2013 |

*Primary Examiner* — Ishwarbhai B Patel
(74) *Attorney, Agent, or Firm* — JCIPRNET

(57) ABSTRACT

A printed circuit board stack structure includes a first printed circuit board, a second printed circuit board, and a filling glue layer. The first printed circuit board has at least one overflow groove, and includes first pads and a retaining wall surrounding the first pads. The second printed circuit board is disposed on the first printed circuit board, and includes second pads and conductive pillars located on some of the second pads. The conductive pillars are respectively connected to some of the first pads to electrically connect the second printed circuit board to the first printed circuit board. The filling glue layer fills between the first and the second printed circuit boards, and covers the first pads, the second pads, and the conductive pillars. The retaining wall blocks the filling glue layer so that a portion of the filling glue layer is accommodated in the overflow groove.

6 Claims, 17 Drawing Sheets

(56) References Cited

U.S. PATENT DOCUMENTS

2015/0179614 A1\* 6/2015 Murai ................... H01L 25/50
257/784
2022/0020674 A1\* 1/2022 Huang ............. H01L 23/49822

\* cited by examiner

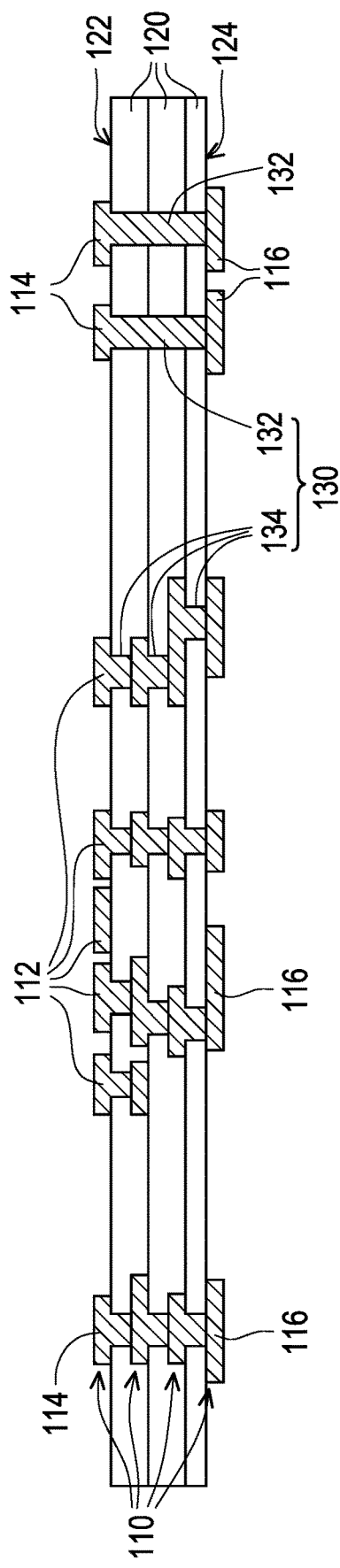
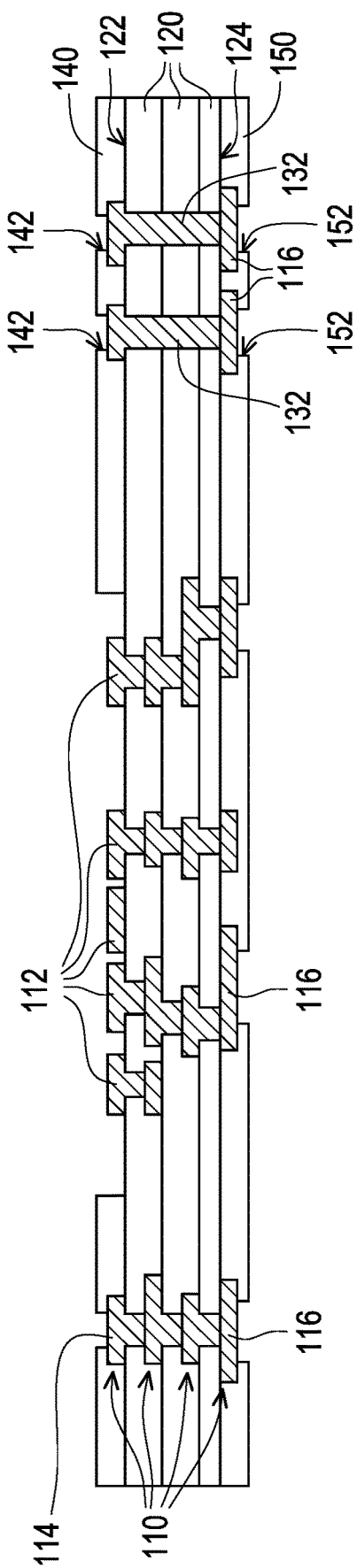
FIG. 1A
FIG. 1B

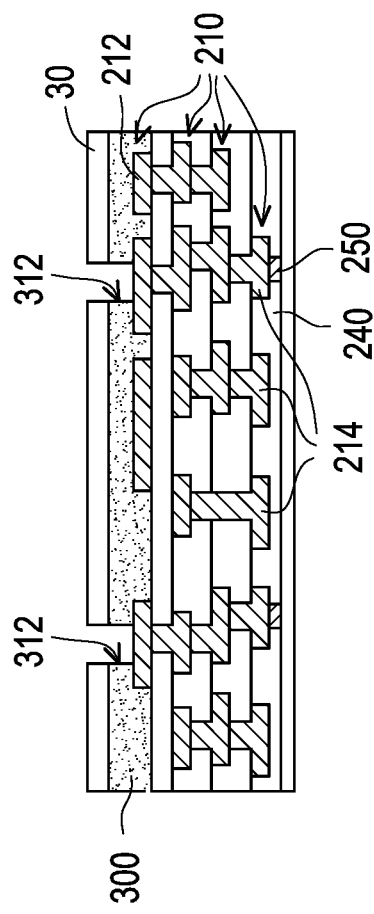
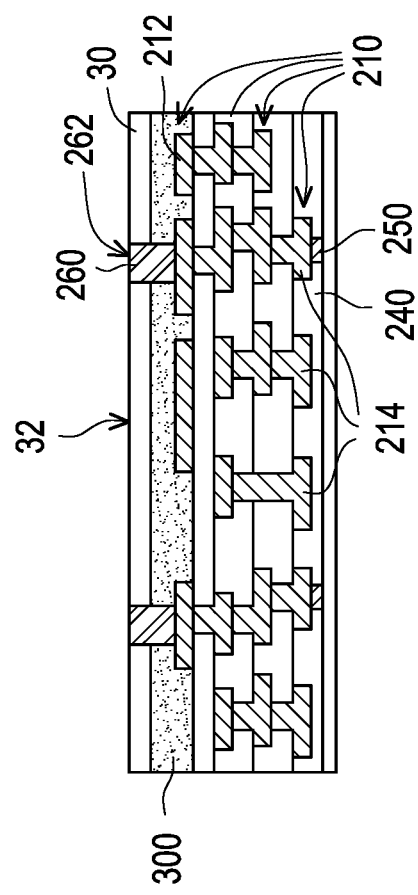

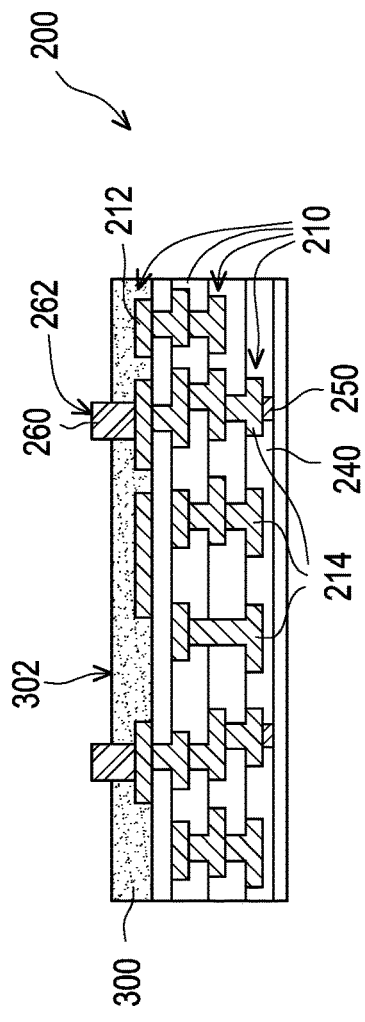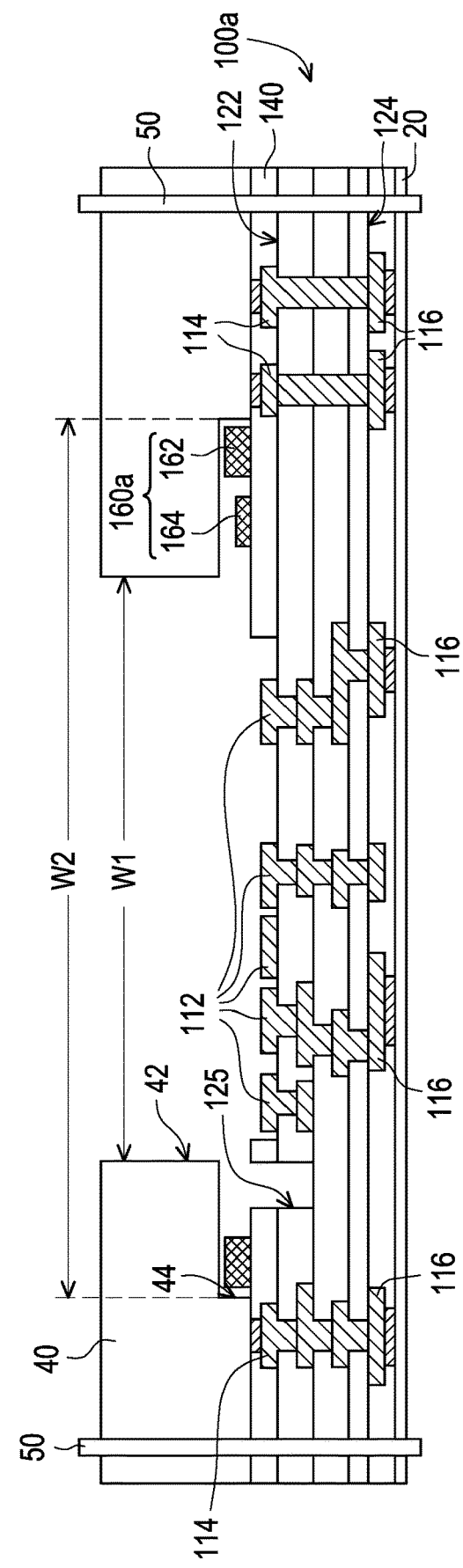

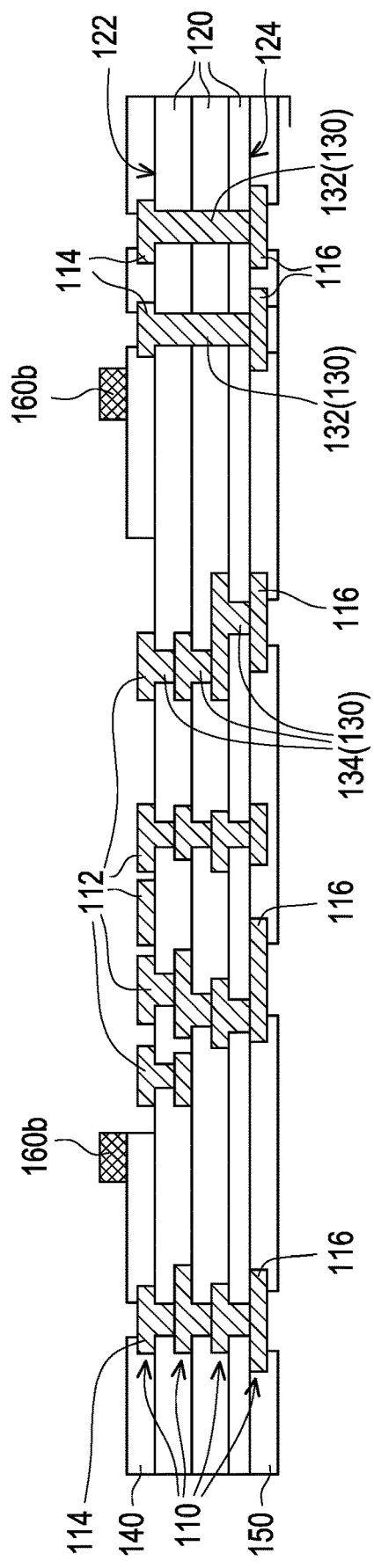
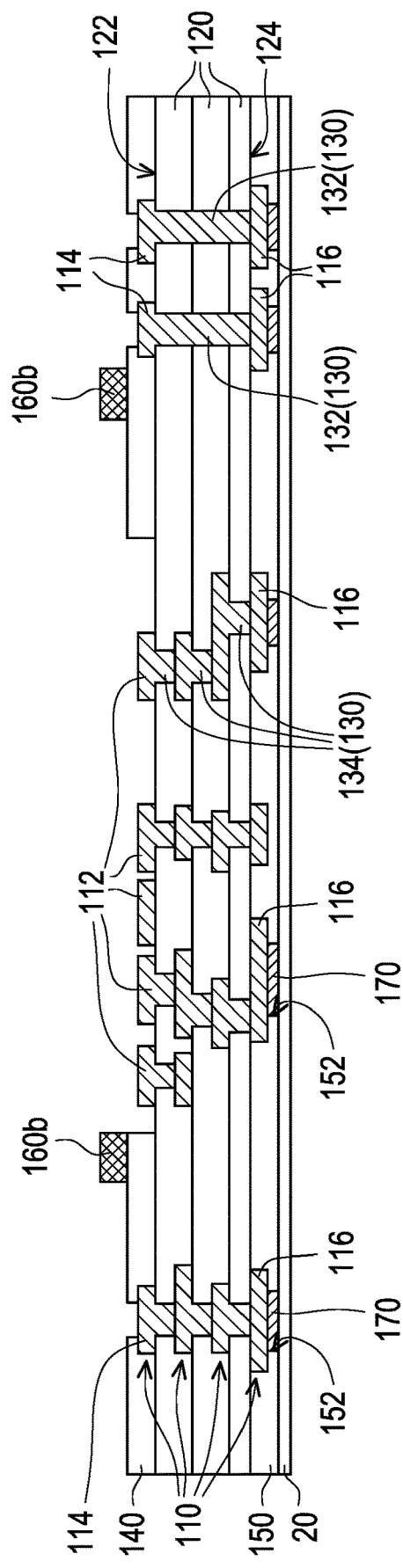
FIG. 2A
FIG. 2B

PRINTED CIRCUIT BOARD STACK STRUCTURE AND MANUFACTURING METHOD THEREOF

CROSS-REFERENCE TO RELATED APPLICATION

This application claims the priority benefit of Taiwan application serial no. 111102825, filed on Jan. 24, 2022. The entirety of the above-mentioned patent application is hereby incorporated by reference herein and made a part of this specification.

BACKGROUND

Technical Field

The disclosure relates to a circuit board structure and a manufacturing method thereof, and particularly relates to a printed circuit board stack structure and a manufacturing method thereof.

Description of Related Art

The so-called "transient liquid phase sintering (TLPS)" refers to sintering carried out by the transfer of low-melting-point metal to the liquid phase caused by the heating of the low-melting-point metal at the particle interface and the reaction diffusion of high-melting-point metal to the formed liquid phase. According to transient liquid phase sintering, the melting point of the formed sintered metal may exceed the heating temperature used for sintering. However, when applied to connection of a module to a main board (module-to-board), the copper paste filling of the transient liquid phase sintering connection may have the following problems. 1. The filling glue is difficult to control and may easily overflow during press-bonding, and particularly an abnormal glue overflow may cover the pads or gold fingers in the non-bonding area, making it impossible to process. 2. To prevent the overflow, it is necessary to cover the non-bonding area, and consequently a glue blocking material is required during press-bonding to locate the position of the bonding area. However, the glue blocking material is uncured thermosetting resin, which is easy to cause residues when being peeled off after press-bonding, and is difficult to inspect by eyes or instrument. As a result, the main board cannot be processed and has to be scrapped. What is worse, the glue blocking material with insufficient structural strength may reduce the alignment accuracy between the module and the main board. 3. The glue blocking material is expensive and cannot be used repeatedly. Furthermore, the glass transition temperature of the glue blocking material needs to match the glass transition temperature of the filling glue and copper paste, which restricts the selection of the filling glue and copper paste.

SUMMARY

The disclosure provides a printed circuit board stack structure, in which a filling glue layer does not overflow to a non-bonding area, thus improving the electrical reliability.

The disclosure provides a manufacturing method for manufacturing a printed circuit board stack structure, which does not require a glue blocking material, thus eliminating the problem of glue residues, effectively reducing the cost, and improving the yield.

A printed circuit board stack structure according to an embodiment of the disclosure includes a first printed circuit board, a second printed circuit board, and a filling glue layer. The first printed circuit board has a first surface and a second surface opposite to each other and at least one overflow groove extending from the first surface toward the second surface, and includes a plurality of first pads located on the first surface and a retaining wall surrounding the first pads. The second printed circuit board is disposed on the first printed circuit board, and includes a plurality of second pads and a plurality of conductive pillars located on some of the second pads. The conductive pillars are respectively connected to some of the first pads so that the second printed circuit board is electrically connected to the first printed circuit board. The filling glue layer is filled between the first printed circuit board and the second printed circuit board, and covers the first pads, the second pads, and the conductive pillars. The retaining wall blocks the filling glue layer so that a portion of the filling glue layer is accommodated in the overflow groove.

In an embodiment of the disclosure, a size of the first printed circuit board is larger than a size of the second printed circuit board. The second printed circuit board has a first density circuit area and a second density circuit area, and a wiring density in the first density circuit area is greater than a wiring density in the second density circuit area.

In an embodiment of the disclosure, the at least one overflow groove is one overflow groove, and the retaining wall includes a first retaining wall and a second retaining wall. A first height of the first retaining wall is greater than a second height of the second retaining wall. The first retaining wall surrounds the first pads, the second retaining wall, and the overflow groove. The first density circuit area is relatively close to the overflow groove and the second density circuit area is relatively close to the second retaining wall. The overflow groove, the first retaining wall, and the second retaining wall restrict the filling glue layer so that the filling glue layer is located inside the first retaining wall.

In an embodiment of the disclosure, the at least one overflow groove includes a first overflow groove and a second overflow groove. The first overflow groove is adjacent to the retaining wall and is located outside the retaining wall, and the second overflow groove is located inside the retaining wall. The first density circuit area is relatively close to the second overflow groove and the second density circuit area is relatively close to the first overflow groove. The filling glue layer relatively close to the second density circuit area is filled into the first overflow groove along the retaining wall, and the filling glue layer relatively close to the first density circuit area is blocked by the retaining wall to fill the second overflow groove.

In an embodiment of the disclosure, the at least one overflow groove is one overflow groove, and the retaining wall includes a first retaining wall and a second retaining wall. A first height of the first retaining wall is greater than a second height of the second retaining wall. The first retaining wall surrounds the first pads and the second retaining wall, and the overflow groove is adjacent to the first retaining wall and is located outside the first retaining wall. The first density circuit area is relatively close to the second retaining wall and the second density circuit area is relatively close to the overflow groove. The filling glue layer relatively close to the second density circuit area is filled into the overflow groove along the first retaining wall, and the filling glue layer relatively close to the first density circuit area is blocked by the second retaining wall and the first retaining wall and is located inside the first retaining wall.

In an embodiment of the disclosure, the first printed circuit board further includes a plurality of third pads, a plurality of fourth pads, and a plurality of conductive members. The third pads are located on the first surface and surround the retaining wall. The fourth pads are located on the second surface, and the third pads are electrically connected to the fourth pads through the conductive members.

In an embodiment of the disclosure, the first printed circuit board further includes a first solder resist layer, a second solder resist layer, a first surface treatment layer, and a second surface treatment layer. The first solder resist layer is located on the first surface and has a plurality of first solder resist openings. The first solder resist openings expose the first pads and some of the third pads. The second solder resist layer is located on the second surface and has a plurality of second solder resist openings. The second solder resist openings expose some of the fourth pads. The first surface treatment layer is located on the fourth pads exposed by the second solder resist openings, and the second surface treatment layer is located on the third pads exposed by the first solder resist openings.

In an embodiment of the disclosure, the retaining wall is located on the first solder resist layer, and a material of the retaining wall is the same as a material of the first solder resist layer.

In an embodiment of the disclosure, the second printed circuit board has a third surface and a fourth surface opposite to each other, and includes a plurality of fifth pads and a plurality of conductive members. The second pads are located on the third surface, the fifth pads are located on the fourth surface, and the second pads are electrically connected to the fifth pads through the conductive members.

In an embodiment of the disclosure, the second printed circuit board further includes a solder resist layer and a surface treatment layer. The solder resist layer is located on the fourth surface and has a plurality of solder resist openings. The solder resist openings expose some of the fifth pads, and the surface treatment layer is located on the fifth pads exposed by the solder resist openings.

A manufacturing method for manufacturing a printed circuit board stack structure according to an embodiment of the disclosure includes the following. A first printed circuit board is provided. The first printed circuit board has a first surface and a second surface opposite to each other and at least one overflow groove extending from the first surface toward the second surface, and includes a plurality of first pads located on the first surface and a retaining wall surrounding the first pads. A second printed circuit board formed with a filling glue layer is provided. The filling glue layer has a plurality of openings, and the second printed circuit board includes a plurality of second pads and a plurality of conductive pillars. The openings respectively expose some of the second pads, and the conductive pillars are located in the openings and are electrically connected to the second pads. A top surface of each the conductive pillars is higher than an upper surface of the filling glue layer, and the filling glue layer is in a B-stage state. A jig is provided on the first printed circuit board. The jig has a first opening and a second opening communicating with each other. A diameter of the second opening is larger than a diameter of the first opening, and the second opening is located between the first opening and the first surface of the first printed circuit board. The first opening corresponds to the first pads, and the retaining wall and the overflow groove are located in the second opening. The second printed circuit board is disposed through the first opening and the second opening of the jig and is press-bonded to the first printed circuit board.

The conductive pillars are respectively connected to some of the first pads so that the second printed circuit board is electrically connected to the first printed circuit board. The filling glue layer is filled between the first printed circuit board and the second printed circuit board, and covers the first pads, the second pads, and the conductive pillars. The retaining wall blocks the filling glue layer so that a portion of the filling glue layer is accommodated in the overflow groove. The filling glue layer changes from the B-stage state to a C-stage state.

In an embodiment of the disclosure, a size of the first printed circuit board is larger than a size of the second printed circuit board. The second printed circuit board has a first density circuit area and a second density circuit area, and a wiring density in the first density circuit area is greater than a wiring density in the second density circuit area.

In an embodiment of the disclosure, the at least one overflow groove is one overflow groove, and the retaining wall includes a first retaining wall and a second retaining wall. A first height of the first retaining wall is greater than a second height of the second retaining wall. The first retaining wall surrounds the first pads, the second retaining wall, and the overflow groove. When the second printed circuit board is disposed through the first opening and the second opening of the jig and is press-bonded to the first printed circuit board, the first density circuit area is relatively close to the overflow groove, and the second density circuit area is relatively close to the second retaining wall. The overflow groove, the first retaining wall, and the second retaining wall restrict the filling glue layer so that the filling glue layer is located inside the first retaining wall.

In an embodiment of the disclosure, the at least one overflow groove includes a first overflow groove and a second overflow groove. The first overflow groove is adjacent to the retaining wall and is located outside the retaining wall, and the second overflow groove is located inside the retaining wall. When the second printed circuit board is disposed through the first opening and the second opening of the jig and is press-bonded to the first printed circuit board, the first density circuit area is relatively close to the second overflow groove, and the second density circuit area is relatively close to the first overflow groove. The filling glue layer relatively close to the second density circuit area is filled into the first overflow groove along the retaining wall, and the filling glue layer relatively close to the first density circuit area is blocked by the retaining wall to fill the second overflow groove.

In an embodiment of the disclosure, the at least one overflow groove is one overflow groove, and the retaining wall includes a first retaining wall and a second retaining wall. A first height of the first retaining wall is greater than a second height of the second retaining wall. The first retaining wall surrounds the first pads and the second retaining wall, and the overflow groove is adjacent to the first retaining wall and is located outside the first retaining wall. When the second printed circuit board is disposed through the first opening and the second opening of the jig and is press-bonded to the first printed circuit board, the first density circuit area is relatively close to the second retaining wall, and the second density circuit area is relatively close to the overflow groove. The filling glue layer relatively close to the second density circuit area is filled into the overflow groove along the first retaining wall, and the filling glue layer relatively close to the first density circuit area is blocked by the second retaining wall and the first retaining wall and is located inside the first retaining wall.

In an embodiment of the disclosure, the first printed circuit board further includes a plurality of third pads, a plurality of fourth pads, and a plurality of conductive members. The third pads are located on the first surface and surround the retaining wall. The fourth pads are located on the second surface, and the third pads are electrically connected to the fourth pads through the conductive members.

In an embodiment of the disclosure, providing the first printed circuit board further includes: forming a first solder resist layer on the first surface. The first solder resist layer has a plurality of first solder resist openings, and the first solder resist openings expose the first pads and some of the third pads. A second solder resist layer is formed on the second surface. The second solder resist layer has a plurality of second solder resist openings, and the second solder resist openings expose some of the fourth pads. A first surface treatment layer is formed on the fourth pads exposed by the second solder resist openings. A second surface treatment layer is formed on the third pads exposed by the first solder resist openings.

In an embodiment of the disclosure, the retaining wall is located on the first solder resist layer, and a material of the retaining wall is the same as a material of the first solder resist layer.

In an embodiment of the disclosure, the second printed circuit board has a third surface and a fourth surface opposite to each other, and includes a plurality of fifth pads and a plurality of conductive members. The second pads are located on the fifth surface, the fifth pads are located on the fourth surface, and the second pads are electrically connected to the third pads through the conductive members.

In an embodiment of the disclosure, providing the second printed circuit board further includes: forming a solder resist layer on the fourth surface. The solder resist layer has a plurality of solder resist openings, and the solder resist openings expose some of the fifth pads. A surface treatment layer is formed on the fifth pads exposed by the solder resist openings.

In an embodiment of the disclosure, the manufacturing method for manufacturing the printed circuit board stack structure further includes: after providing the jig on the first printed circuit board and before disposing the second printed circuit board through the first opening and the second opening of the jig and press-bonding the second printed circuit board to the first printed circuit board, providing a plurality of fasteners to penetrate the jig and the first printed circuit board so that the jig is fixed to the first printed circuit board. When disposing the second printed circuit board through the first opening and the second opening of the jig and press-bonding the second printed circuit board to the first printed circuit board, a minimum distance is formed respectively between the jig and the retaining wall of the first printed circuit board and the second printed circuit board. After disposing the second printed circuit board through the first opening and the second opening of the jig and press-bonding the second printed circuit board to the first printed circuit board, the jig, the fasteners, and a portion of the first printed circuit board are removed.

Based on the above, in the design of the printed circuit board stack structure of the disclosure, the surface of the first printed circuit board has the overflow groove and includes the retaining wall surrounding the first pads. Therefore, when the second printed circuit board is connected to the first printed circuit board, the filling glue layer located between the first printed circuit board and the second printed circuit board is blocked by the retaining wall so that a portion of the filling glue layer is accommodated in the overflow groove and does not overflow to the non-bonding area. Accordingly, the printed circuit board stack structure of the disclosure has improved electrical reliability. In addition, the manufacturing method of the printed circuit board stack structure of the disclosure does not require a glue blocking material, which eliminates the problem of glue residues, effectively reduces the cost, and improves the yield.

In order to make the above-mentioned and other features and advantages of the disclosure easier to understand, exemplary embodiments are described in detail hereinafter with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A to FIG. 2H are schematic cross-sectional views showing some steps of a manufacturing method for manufacturing a printed circuit board stack structure according to another embodiment of the disclosure.

DETAILED DESCRIPTION OF DISCLOSED EMBODIMENTS

Figure 1C:
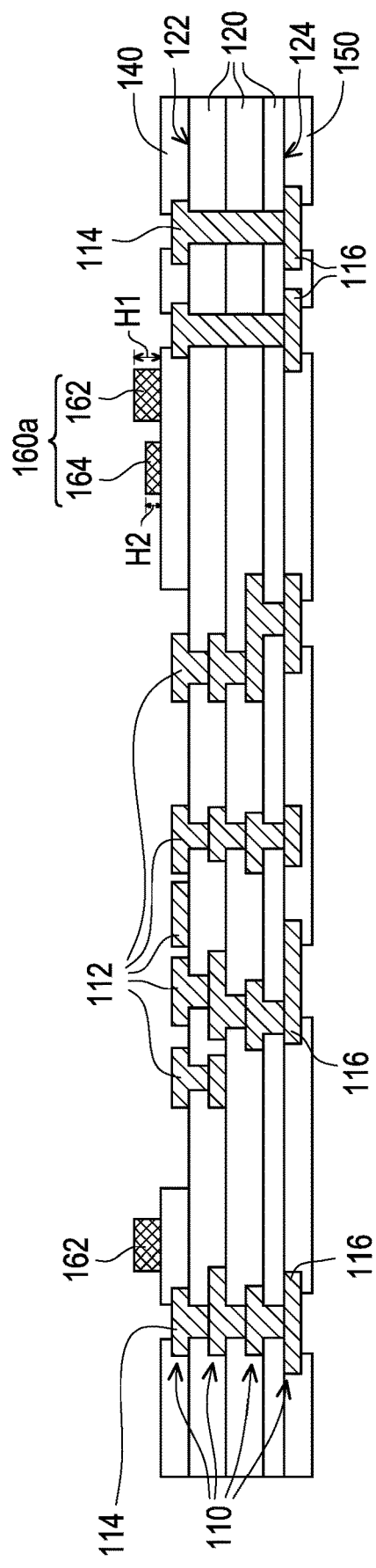
FIG. 1A to FIG. 1Q are schematic cross-sectional views showing a manufacturing method for manufacturing a printed circuit board stack structure according to an embodiment of the disclosure.
Figure 1D:
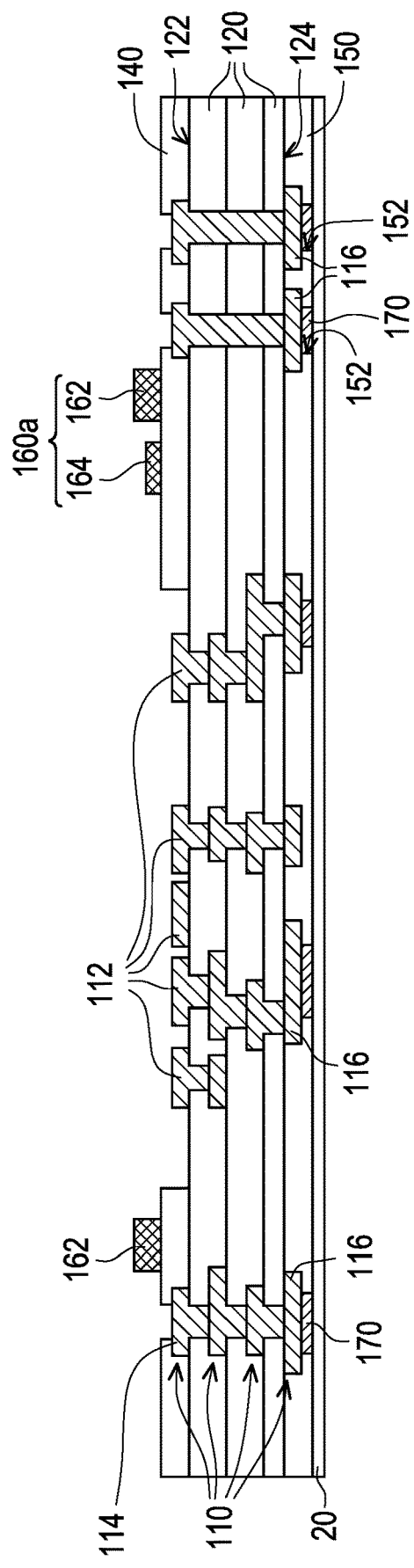
Figure 1E:
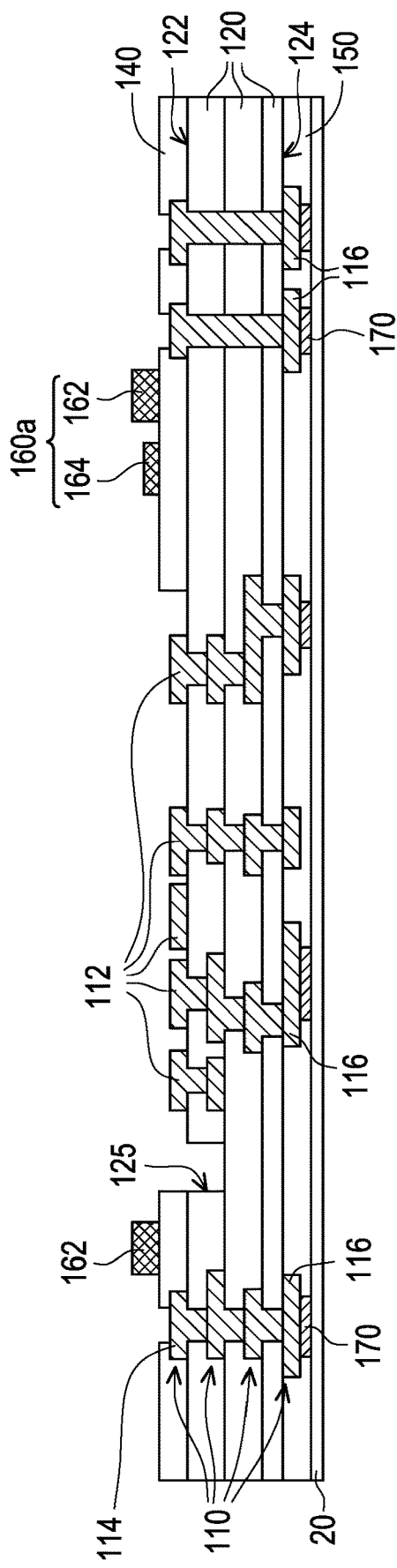
Figure 1F:
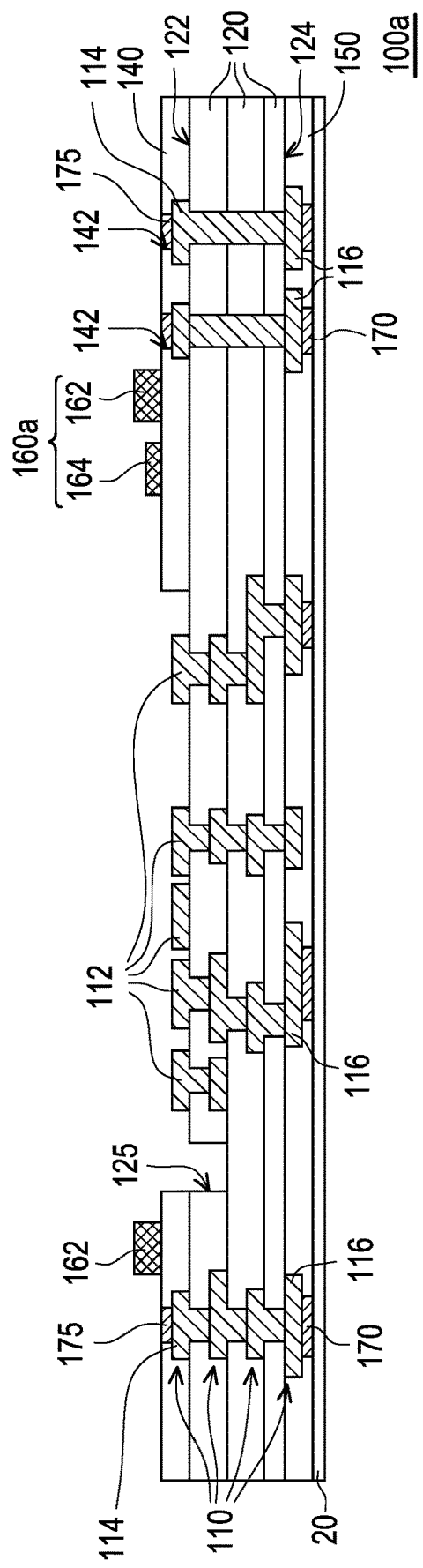
Figure 1G:
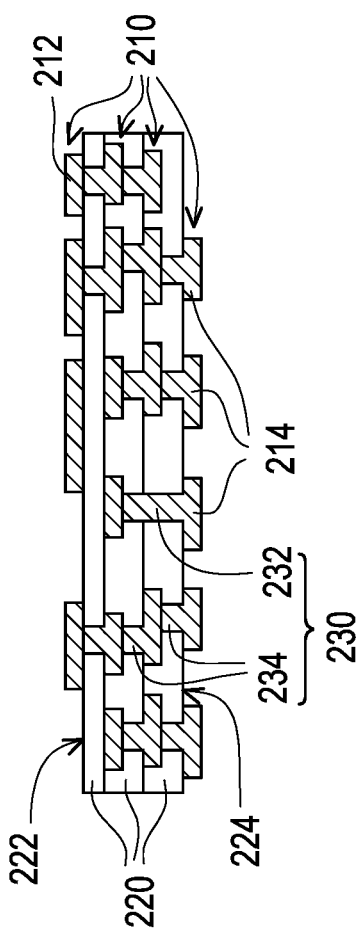
Figure 1H:
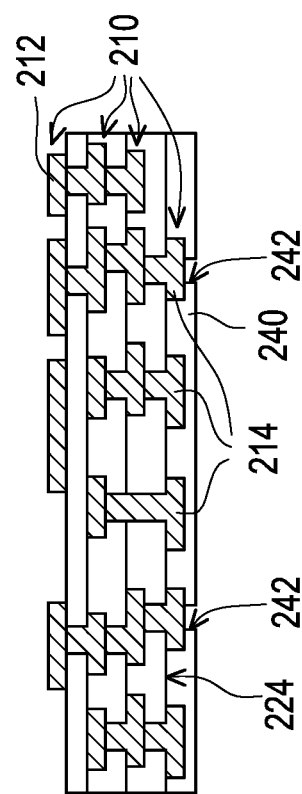
Figure 1I:
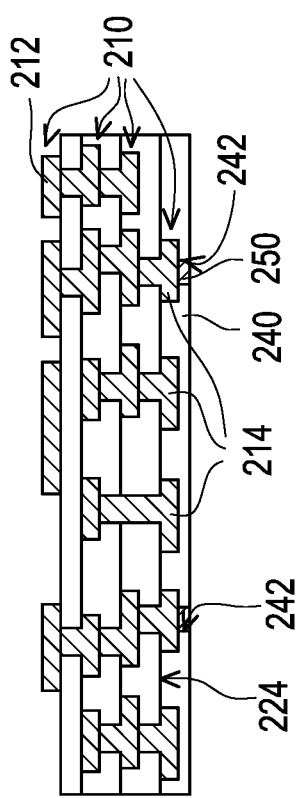
Figure 1J:
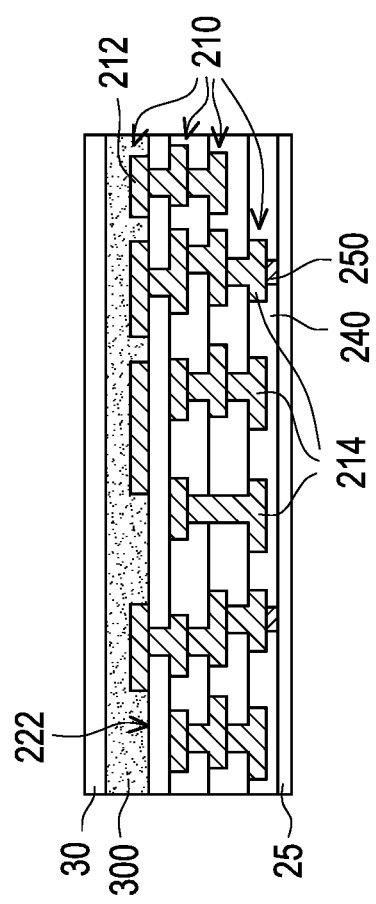
Figure 10:
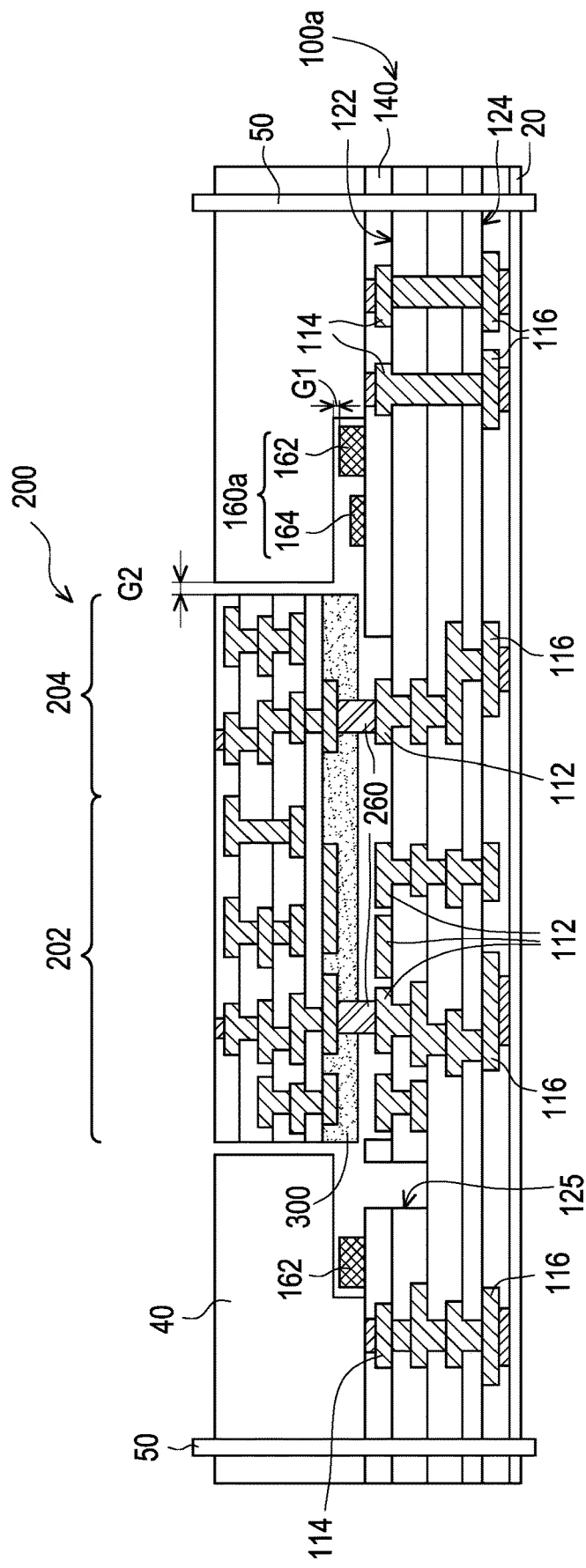
Figure 1P:
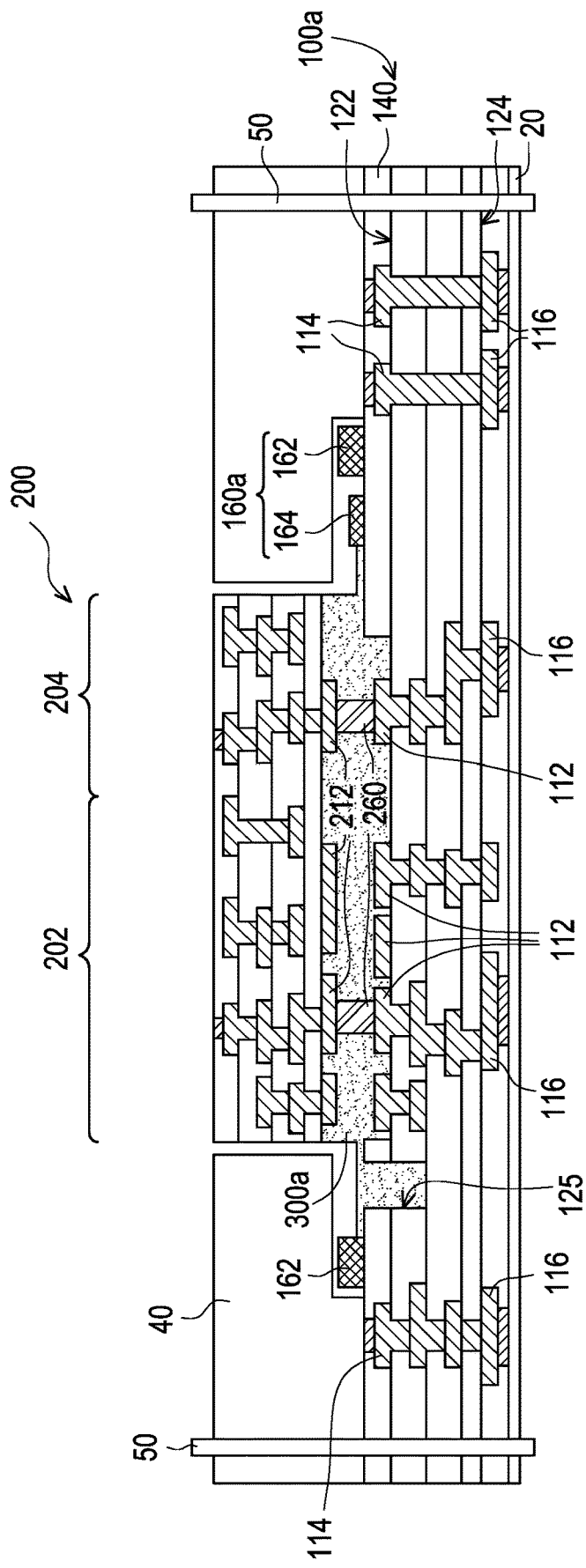
Figure 1Q:
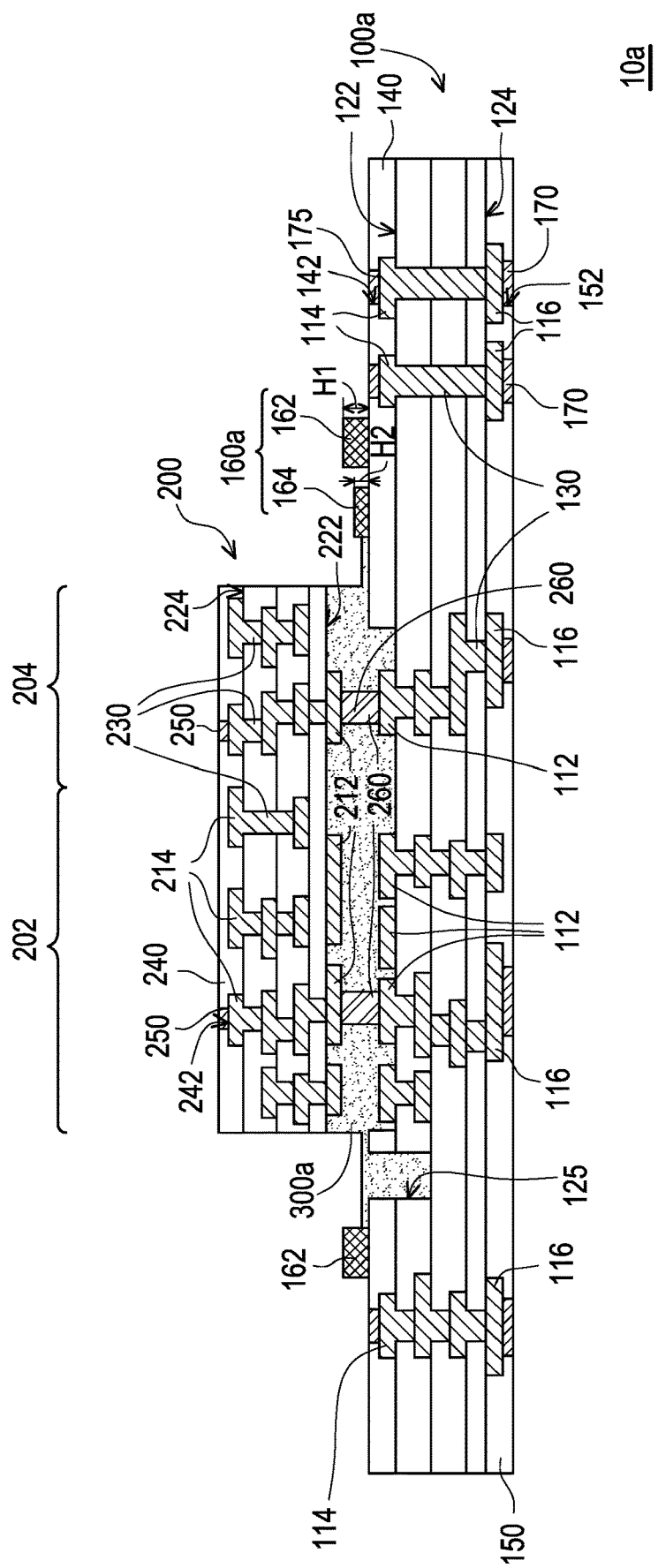

FIG. 1A to FIG. 1Q are schematic cross-sectional views showing a manufacturing method for manufacturing a printed circuit board stack structure according to an embodiment of the disclosure. Regarding the manufacturing method of the printed circuit board stack structure of this embodiment, first, referring to FIG. 1F, a first printed circuit board 100a is provided. The first printed circuit board 100a has a first surface 122 and a second surface 124 opposite to each other and at least one overflow groove (one overflow groove 125 is schematically shown) extending from the first surface 122 toward the second surface 124. The first printed circuit board 100a also includes a plurality of first pads 112 located on the first surface 122 and a retaining wall 160a surrounding the first pads 112.

In detail, the step of providing the first printed circuit board 100a includes the following. First, referring to FIG. 1A, a plurality of circuit layers 110, a plurality of dielectric layers 120, and a plurality of conductive members 130 are formed. The circuit layers 110 and the dielectric layers 120 are alternately stacked, and the circuit layers 110 are electrically connected to one another through the conductive members 130. The outermost two circuit layers 110 respectively include a plurality of first pads 112, a plurality of third pads 114, and a plurality of fourth pads 116. The first pads 112 and the third pads 114 are located on the first surface 122 of one of the outermost two dielectric layers 120, and the fourth pads 116 are located on the second surface of the other of the outermost two dielectric layers 120. Here, the first pads 112 are located in a bonding area, and the third pads 114 surround the first pads 112 and are located in a non-bonding area. The conductive members 130 include a plurality of conductive through holes 132 and a plurality of conductive blind holes 134. The circuit layers 110 are electrically connected to one another through the conductive blind holes 134, and the third pads 114 are electrically connected to the fourth pads 116 through the conductive through holes 132.

Next, referring to FIG. 1B, a first solder resist layer 140 is formed on the first surface 122, and a second solder resist layer 150 is formed on the second surface 124. The first solder resist layer 140 has a plurality of first solder resist openings 142, and the first solder resist openings 142 expose the first pads 112 and some of the third pads 114. The second solder resist layer 150 has a plurality of second solder resist openings 152, and the second solder resist openings 152 expose some of the fourth pads 116. The first solder resist layer 140 and the second solder resist layer 150 are formed by, for example, a coating method, and the first solder resist openings 142 and the second solder resist openings 152 are formed by, for example, exposure and development. Here, the material of the first solder resist layer 140 and the material of the second solder resist layer 150 are, for example, a dry film photosensitive material or a liquid photosensitive material respectively, but the disclosure is not limited thereto.

Next, referring to FIG. 1C, a retaining wall 160a is formed on the first solder resist layer 140. The retaining wall 160a includes a first retaining wall 162 and a second retaining wall 164. A first height H1 of the first retaining wall 162 is greater than a second height H2 of the second retaining wall 164. That is, the retaining wall 160a of this embodiment is located on the first solder resist layer 140. Preferably, the material of the retaining wall 160a may be the same as the material of the first solder resist layer 140, but the disclosure is not limited thereto. Here, the first retaining wall 162 surrounds the first pads 112 and the second retaining wall 164, and the third pads 114 surround the retaining wall 160a. Next, the first solder resist layer 140, the second solder resist layer 150, and the retaining wall 160a are baked to be cured (postcure).

Next, referring to FIG. 1D, optionally, a first surface treatment layer 170 is formed on the fourth pads 116 exposed by the second solder resist openings 152. Here, the material of the first surface treatment layer 170 is, for example, electroless nickel electroless palladium immersion gold (ENEPIG), organic solderability preservatives (OSP) or electroless nickel immersion gold (ENIG), but the disclosure is not limited thereto. Next, a protective layer 20 is attached to the second solder resist layer 150 and the first surface treatment layer 170 for protection. Here, the material of the protective layer 20 is, for example, high temperature resistant polyimide (PI).

Next, referring to FIG. 1E, the overflow groove 125 extending from the first surface 122 toward the second surface 124 is formed. The first retaining wall 162 surrounds the first pads 112, the second retaining wall 164, and the overflow groove 125. In view of FIG. 1E, the second retaining wall 164 only partially surrounds the first pads 112. Here, the overflow groove 125 may be formed by routing, but the disclosure is not limited thereto. In particular, the width of the overflow groove 125 may be adjusted according to the estimated overflow amount, and basically the depth of the overflow groove 125 does not pass through the lowermost circuit layer 110. In other words, the overflow groove 125 of this embodiment may be adjusted according to the actual circuit layout, and may be a closed curve or a non-closed curve.

Next, referring to FIG. 1F, a second surface treatment layer 175 is formed on the third pads 114 exposed by the first solder resist openings 142. Here, the material of the second surface treatment layer 175 is, for example, electroless nickel electroless palladium immersion gold (ENEPIG), organic solderability preservatives (OSP) or electroless nickel immersion gold (ENIG), but the disclosure is not limited thereto. Accordingly, the fabrication of the first printed circuit board 100a is completed.

Next, referring to FIG. 1M, a second printed circuit board 200 having a filling glue layer 300 formed thereon is provided. At this time, the filling glue layer 300 is in a B-stage state, which means that the filling glue layer 300 is in an incompletely cured state.

In detail, the step of providing the second printed circuit board 200 includes the following. First, referring to FIG. 1G, a plurality of circuit layers 210, a plurality of dielectric layers 220, and a plurality of conductive members 230 are formed. The circuit layers 210 and the dielectric layers 220 are alternately stacked, and the circuit layers 210 are electrically connected to one another through the conductive members 230. The outermost two circuit layers 210 respectively include a plurality of second pads 212 and a plurality of fifth pads 214. The second pads 212 are located on the third surface 222 of one of the outermost two dielectric layers 220, and the fifth pads 214 are located on the fourth surface 224 of the other of the outermost two dielectric layers 220. The conductive members 230 include a plurality of conductive through holes 232 and a plurality of conductive blind holes 234. The second pads 212 are electrically connected to the fifth pads 214 through the conductive through holes 232 and the conductive blind holes 234.

Next, referring to FIG. 1H, a solder resist layer 240 is formed on the fourth surface 224. The solder resist layer 240 has a plurality of solder resist openings 242, and the solder resist openings 242 expose some of the fifth pads 214. The solder resist layer 240 is formed by, for example, a coating method, and the solder resist openings 242 are formed by, for example, exposure and development. Here, the material of the solder resist layer 240 is, for example, a dry film photosensitive material or a liquid photosensitive material, but the disclosure is not limited thereto.

Next, referring to FIG. 1I, a surface treatment layer 250 is formed on the fifth pads 214 exposed by the solder resist openings 242. The material of the surface treatment layer 250 is, for example, electroless nickel electroless palladium immersion gold (ENEPIG), organic solderability preservatives (OSP) or electroless nickel immersion gold (ENIG), but the disclosure is not limited thereto.

Next, referring to FIG. 1J, a protective layer 25 is attached to the solder resist layer 240 and the surface treatment layer 250 for protection. Here, the material of the protective layer 25 is, for example, polyethylene terephthalate (PET), but the disclosure is not limited thereto. Next, a filling glue layer 300 and a protective layer 30 located on the filling glue layer 300 are formed on the third surface 222. The filling glue layer 300 covers the third surface 222 and the second pads 212, and the filling glue layer 300 is located between the protective layer 30 and the third surface 222. Here, the material of the filling glue layer 300 is, for example, a prepreg or an Ajinomoto Build up Film (ABF) that has a glass transition temperature higher than 170° C. and is in a B-stage state, which means that the filling glue layer 300 is in an incompletely cured state.

Next, referring to FIG. 1K, a plurality of openings 312 extending from the protective layer 30 to the second pads 212 are formed. The openings 312 expose some of the second pads 212. Here, the openings 312 are formed by, for example, laser drilling, but the disclosure is not limited thereto.

Next, referring to FIG. 1L, a plurality of conductive pillars 260 are formed in the openings 312. The conductive pillars 260 are electrically connected to the second pads 212. At this time, a top surface 262 of the conductive pillar 260 is flush with a surface 32 of the protective layer 30. The conductive pillars 260 are formed by, for example, filling the openings with conductive paste and then air-drying the conductive paste.

Next, referring to FIG. 1L and FIG. 1M, the protective layer 30 is removed to expose an upper surface 302 of the filling glue layer 300. The top surface 262 of the conductive pillar 260 is higher than the upper surface 302 of the filling glue layer 300. Here, the protective layer 30 is removed by, for example, peeling, but the disclosure is not limited thereto. In an embodiment, a singulation process may be selectively performed to cut and form a plurality of second printed circuit boards 200. Accordingly, the fabrication of the second printed circuit board 200 is completed.

Next, referring to FIG. 1N, a jig 40 is provided on the first printed circuit board 100a. The jig 40 has a first opening 42 and a second opening 44 that communicate with each other. A diameter W2 of the second opening 44 is larger than a diameter W1 of the first opening 42, and the second opening 44 is located between the first opening 42 and the first surface 122 of the first printed circuit board 100a. At this time, the jig 40 directly contacts the first solder resist layer 140, the first opening 42 corresponds to the first pads 112, and the retaining wall 160a and the overflow groove 125 are located in the second opening 44. Here, the jig 40 is actually a rigid board having a certain structural strength. The bonding area may be defined through the structure and arrangement of the jig 40, and the jig 40 is reusable, which can effectively reduce the manufacturing cost. Next, a plurality of fasteners 50 are provided to penetrate the jig 40 and the first printed circuit board 100a so that the jig 40 is fixed to the first printed circuit board 100a. Here, the fastener 50 is, for example, a rivet or a pin, but the disclosure is not limited thereto.

Next, referring to FIG. 1O, the second printed circuit board 200 is disposed through the first opening 42 and the second opening 44 of the jig 40 and is connected to the first printed circuit board 100a so as to combine the second printed circuit board 200 and the first printed circuit board 100a. As shown in FIG. 1O, the size of the first printed circuit board 100a is larger than the size of the second printed circuit board 200. The first printed circuit board 100a may be regarded as a main board and the second printed circuit board 200 may be regarded as a module, and the second printed circuit board 200 and the first printed circuit board 100a are combined in a package-on-package (POP) connection manner.

Further, referring to FIG. 1O again, the second printed circuit board 200 has a first density circuit area 202 and a second density circuit area 204. The wiring density in the first density circuit area 202 is greater than the wiring density in the second density circuit area 204. That is, the first density circuit area 202 may be regarded as a high residual copper rate area and the second density circuit area 204 may be regarded as a low residual copper rate area. The first density circuit area 202 is relatively close to the overflow groove 125 and the second density circuit area 204 is relatively close to the second retaining wall 164. The conductive pillars 260 of the second printed circuit board 200 are respectively connected to some of the first pads 112 so that the second printed circuit board 200 is electrically connected to the first printed circuit board 100a. At this time, there is a minimum distance G1 between the jig 40 and the retaining wall 160a of the first printed circuit board 100a and there is a minimum distance G2 between the jig 40 and the second printed circuit board 200. Here, the minimum distance G1 is, for example, 200 µm and the minimum distance G2 is, for example, 50 µm.

Thereafter, referring to FIG. 1P, the second printed circuit board 200 is thermally press-bonded to the first printed circuit board 100a. At this time, the filling glue layer 300a is filled between the first printed circuit board 100a and the second printed circuit board 200, and covers the first pads 112, the second pads 212, and the conductive pillars 260. The retaining wall 160a blocks the filling glue layer 300a so that a portion of the filling glue layer 300a is accommodated in the overflow groove 125. That is, the overflow groove 125, the first retaining wall 162, and the second retaining wall 164 restrict the filling glue layer 300a so that the filling glue layer 300a is located inside the first retaining wall 162. In addition, after the thermal press-bonding process, the filling glue layer 300a changes from the B-stage state to a C-stage state, and is completely cured.

More specifically, in the high-density first density circuit area 202, the flow rate of the molten filling glue layer 300a during the thermal press-bonding is relatively fast and the glue overflows more. By disposing the overflow groove 125 and the first retaining wall 162 behind the overflow groove 125, the filling glue layer 300a can be prevented from overflowing to the non-bonding area and affecting the electrical properties of the third pads 114. On the other hand, in the low-density second density circuit area 204, the flow rate of the molten filling glue layer 300a during the thermal press-bonding is relatively slow and the glue overflows less. Therefore, the filling glue layer 300a can be prevented from overflowing to the non-bonding area and affecting the electrical properties of the third pads 114 simply by disposing the second retaining wall 164.

Finally, referring to FIG. 1P and FIG. 1Q, the jig 40, the fasteners 50, the protective layer 20, and a portion of the first printed circuit board 100a are removed to complete the fabrication of the printed circuit board stack structure 10a.

In terms of structure, referring to FIG. 1Q again, in this embodiment, the printed circuit board stack structure 10a includes the first printed circuit board 100a, the second printed circuit board 200, and the filling glue layer 300a. The first printed circuit board 100a has the first surface 122 and the second surface 124 opposite to each other and the overflow groove 125 extending from the first surface 122 toward the second surface 124. The first printed circuit board 100a also includes the first pads 112 on the first surface 122 and the retaining wall 160a surrounding the first pads 112. The second printed circuit board 200 is disposed on the first printed circuit board 100a and includes the second pads 212 and the conductive pillars 26 located on some of the second pads 212. The conductive pillars 260 are respectively connected to some of the first pads 112 so that the second printed circuit board 200 is electrically connected to the first printed circuit board 100a. The filling glue layer 300a is filled between the first printed circuit board 100a and the second printed circuit board 200, and covers the first pads 112, the second pads 212, and the conductive pillars 260. The retaining wall 160a blocks the filling glue layer 300a so that a portion of the filling glue layer 300a is accommodated in the overflow groove 125.

Furthermore, the first printed circuit board 100a further includes the third pads 114, the fourth pads 116, and the conductive members 130. The third pads 114 are located on the first surface 122 and surround the retaining wall 160a. The fourth pads 116 are located on the second surface 124, and the third pads 114 are electrically connected to the fourth pads 116 through the conductive members 130. In addition, the first printed circuit board 100a further includes the first solder resist layer 140, the second solder resist layer 150, the first surface treatment layer 170, and the second surface treatment layer 175. The first solder resist layer 140 is located on the first surface 122 and has the first solder resist openings 142. The first solder resist openings 142 expose the first pads 112 and some of the third pads 114. The second solder resist layer 150 is located on the second surface 124 and has a plurality of second solder resist openings 152. The second solder resist openings 152 expose some of the fourth pads 116. The first surface treatment layer 170 is located on the fourth pads 116 exposed by the second solder resist openings 152, and the second surface treatment layer 175 is located on the third pads 114 exposed by the first solder resist openings 142.

Furthermore, the second printed circuit board 200 of this embodiment has the third surface 222 and the fourth surface 224 opposite to each other, and includes the fifth pads 214 and the conductive members 230. The second pads 212 are located on the third surface 222, the fifth pads 214 are located on the fourth surface 224, and the second pads 212 are electrically connected to the fifth pads 214 through the conductive members 230. In addition, the second printed circuit board 200 further includes the solder resist layer 240 and the surface treatment layer 250. The solder resist layer 240 is located on the fourth surface 224 and has the solder resist openings 242. The solder resist openings 242 expose some of the fifth pads 214, and the surface treatment layer 250 is located on the fifth pads 214 exposed by the solder resist openings 242.

Referring to FIG. 1Q again, in this embodiment, the size of the first printed circuit board 100a is larger than the size of the second printed circuit board 200. The second printed circuit board 200 has the first density circuit area 202 and the second density circuit area 204, and the wiring density in the first density circuit area 202 is greater than the wiring density in the second density circuit area 204. The retaining wall 160a is located on the first solder resist layer 140, and the material of the retaining wall 160a is, for example, the same as the material of the first solder resist layer 140, but the disclosure is not limited thereto. Further, the retaining wall 160a of this embodiment includes the first retaining wall 162 and the second retaining wall 164. The first height H1 of the first retaining wall 162 is greater than the second height H2 of the second retaining wall 164. The first retaining wall 162 surrounds the first pads 112, the second retaining wall 164, and the overflow groove 125. The first density circuit area 202 is relatively close to the overflow groove 125, and the second density circuit area 204 is relatively close to the second retaining wall 164. The overflow groove 125, the first retaining wall 162, and the second retaining wall 164 restrict the filling glue layer 300a so that the filling glue layer 300a is located inside the first retaining wall 162.

In short, in the design of the printed circuit board stack structure 10a of this embodiment, the first surface 122 of the first printed circuit board 100a has the overflow groove 125 and includes the retaining wall 160a surrounding the first pads 112. Therefore, when the second printed circuit board 200 is connected to the first printed circuit board 100a, the filling glue layer 300a located between the first printed circuit board 100a and the second printed circuit board 200 is blocked by the retaining wall 160a so that a portion of the filling glue layer 300a is accommodated in the overflow groove 125 and does not overflow to the non-bonding area. Accordingly, the printed circuit board stack structure 10a of this embodiment has improved electrical reliability. Furthermore, the manufacturing method of the printed circuit board stack structure of this embodiment does not require the conventional glue blocking material, which eliminates the problem of glue residues, effectively reduces the cost, and improves the yield. In addition, in this embodiment, the bonding area is defined by the jig 40 that is a rigid board, which not only is inexpensive and reusable but also improves the alignment accuracy as compared with the conventional art that uses an uncured glue blocking material to locate the bonding area.

It should be noted here that the following embodiments use the reference numerals and part of the content of the foregoing embodiments. The same reference numerals are used to represent the same or similar elements, and the description of the same technical content is omitted. For the description of the omitted part, please refer to the foregoing embodiments, and the repeated description in the following embodiments will be omitted.

FIG. 2A to FIG. 2H are schematic cross-sectional views showing some steps of a manufacturing method for manufacturing a printed circuit board stack structure according to another embodiment of the disclosure. First, after the step of FIG. 1B, that is, after forming the first solder resist layer 140 on the first surface 122 and forming the second solder resist layer 150 on the second surface 124, referring to FIG. 2A, a retaining wall 160b is formed on the first solder resist layer 140. Here, the retaining wall 160b surrounds the first pads 112, and the third pads 114 surround the retaining wall 160b. Preferably, the material of the retaining wall 160b is the same as the material of the first solder resist layer 140. The material of the first solder resist layer 140 is, for example, a dry film photosensitive material or a liquid photosensitive material, but the disclosure is not limited thereto.

Next, referring to FIG. 2B, optionally, a first surface treatment layer 170 is formed on the fourth pads 116 exposed by the second solder resist openings 152. Here, the material of the first surface treatment layer 170 is, for example, electroless nickel electroless palladium immersion gold (ENEPIG), organic solderability preservatives (OSP) or electroless nickel immersion gold (ENIG), but the disclosure is not limited thereto. Next, a protective layer 20 is attached to the second solder resist layer 150 and the first surface treatment layer 170 for protection. Here, the material of the protective layer 20 is, for example, high temperature resistant polyimide (PI).

Figure 2C:
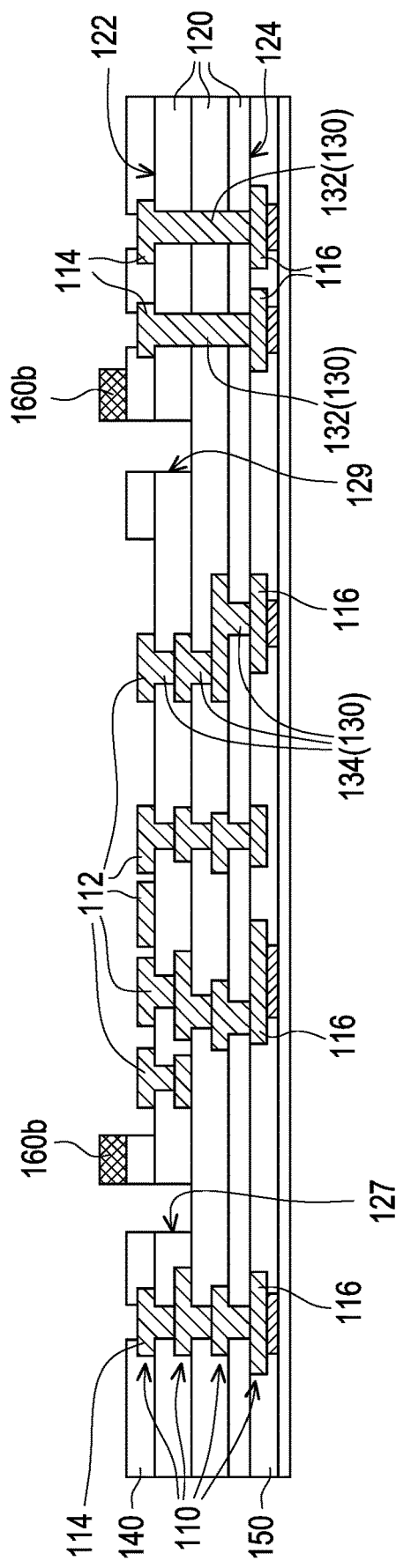

Next, referring to FIG. 2C, a first overflow groove 127 and a second overflow groove 129 extending from the first solder resist layer 140 toward the second surface 124 are formed. The first overflow groove 127 is adjacent to the retaining wall 160b and is located outside the retaining wall 160b, and the second overflow groove 129 is located inside the retaining wall 160b. Here, the first overflow groove 127 and the second overflow groove 129 may be formed by routing, but the disclosure is not limited thereto. In particular, the widths of the first overflow groove 127 and the second overflow groove 129 may be adjusted according to the estimated overflow amount, and the depths of the first overflow groove 127 and the second overflow groove 129 do not pass through the lowermost circuit layer 110. In other words, the first overflow groove 127 and the second overflow groove 129 of this embodiment may be adjusted according to the actual circuit layout, and the first overflow groove 127 and the second overflow groove 129 may each be a closed curve or a non-closed curve.

Figure 2D:
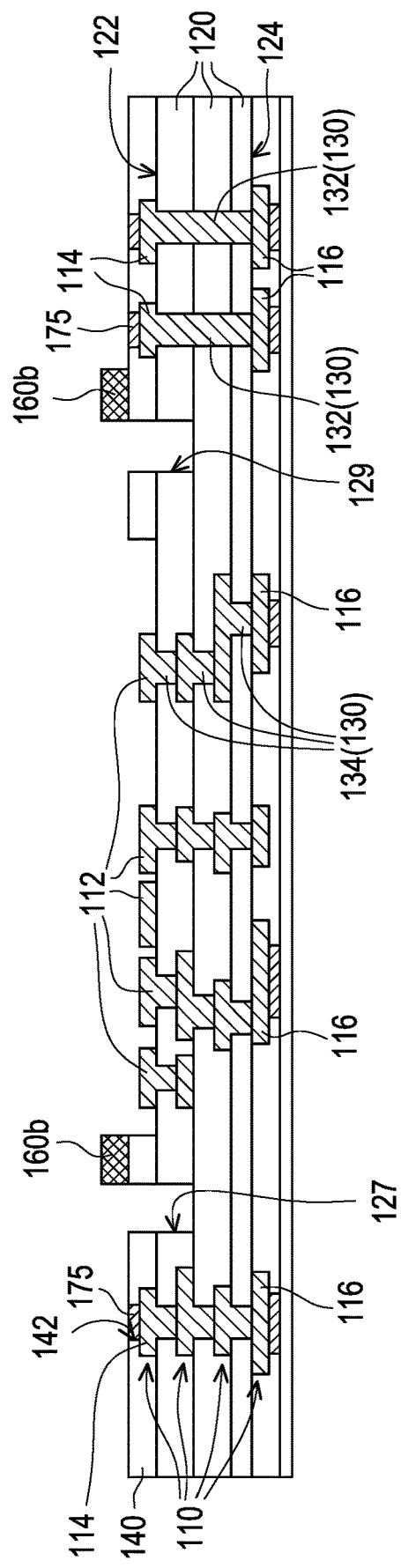

Next, referring to FIG. 2D, a second surface treatment layer 175 is formed on the third pads 114 exposed by the first solder resist openings 142. Here, the material of the second surface treatment layer 175 is, for example, electroless nickel electroless palladium immersion gold (ENEPIG), organic solderability preservatives (OSP) or electroless nickel immersion gold (ENIG), but the disclosure is not limited thereto. Accordingly, the fabrication of the first printed circuit board 100b is completed.

Figure 2E:
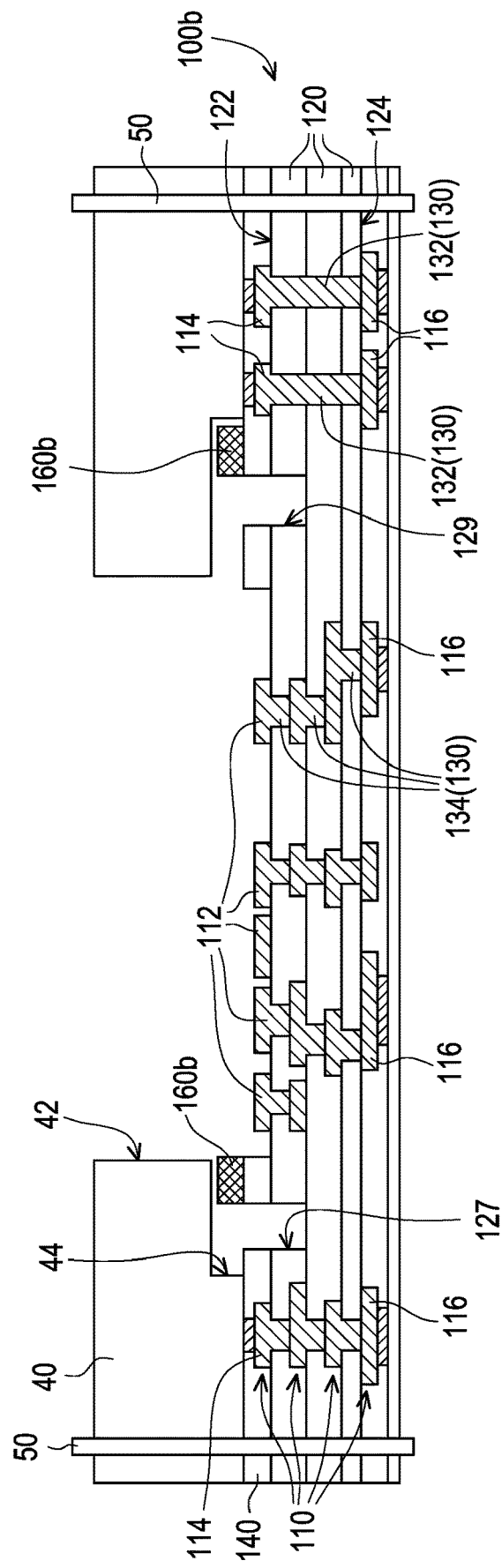

Next, referring to FIG. 2E, a jig 40 is provided on the first printed circuit board 100b. The jig 40 directly contacts the first solder resist layer 140, the first opening 42 corresponds to the first pads 112, and the retaining wall 160b, the first overflow groove 127, and the second overflow groove 129 are located in the second opening 44. Next, fasteners 50 are provided to penetrate the jig 40 and the first printed circuit board 100b so that the jig 40 is fixed to the first printed circuit board 100a. Here, the fastener 50 is, for example, a rivet or a pin, but the disclosure is not limited thereto.

Figure 2F:
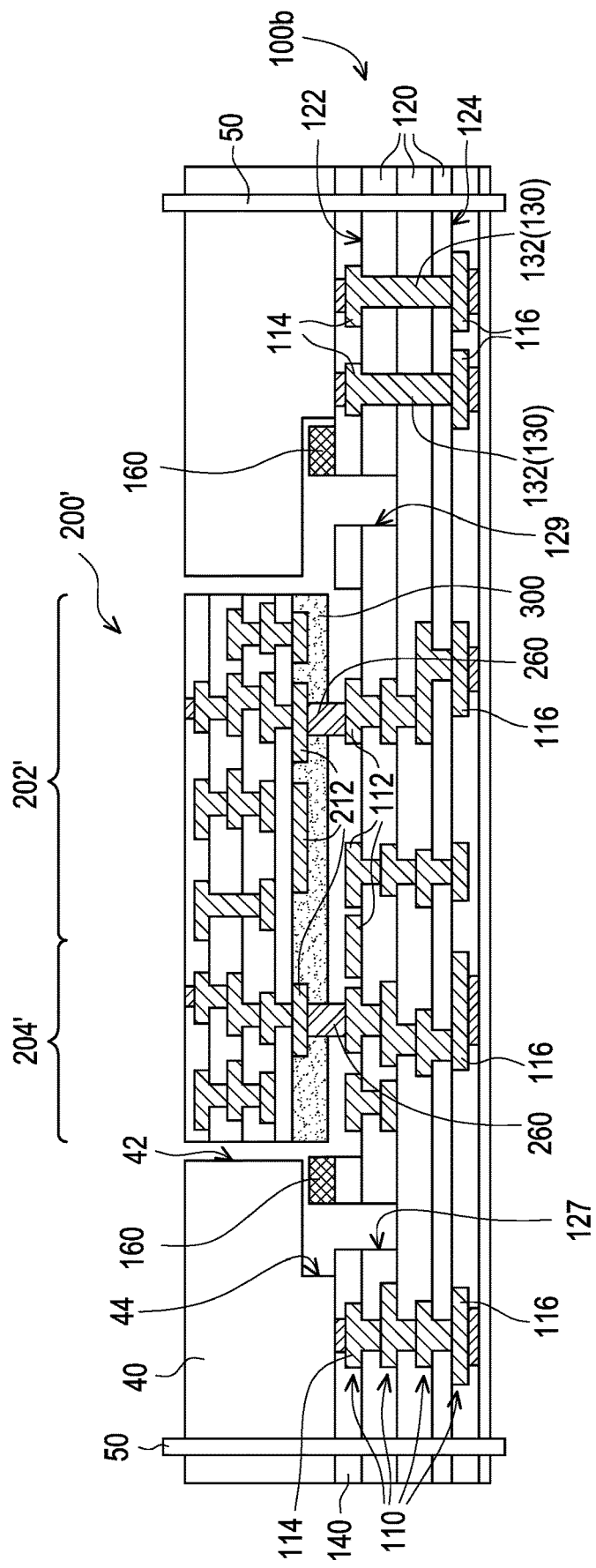

Next, referring to FIG. 2F, the formed second printed circuit board 200' is disposed through the first opening 42 and the second opening 44 of the jig 40 and is connected to the first printed circuit board 100b. At this time, the first density circuit area 202' of the second printed circuit board 200' is relatively close to the second overflow groove 129 and the second density circuit area 204' of the second printed circuit board 200' is relatively close to the first overflow groove 127. The conductive pillars 260 of the second printed circuit board 200' are respectively connected to some of the first pads 112 so that the second printed circuit board 200' is electrically connected to the first printed circuit board 100b.

Figure 2G:
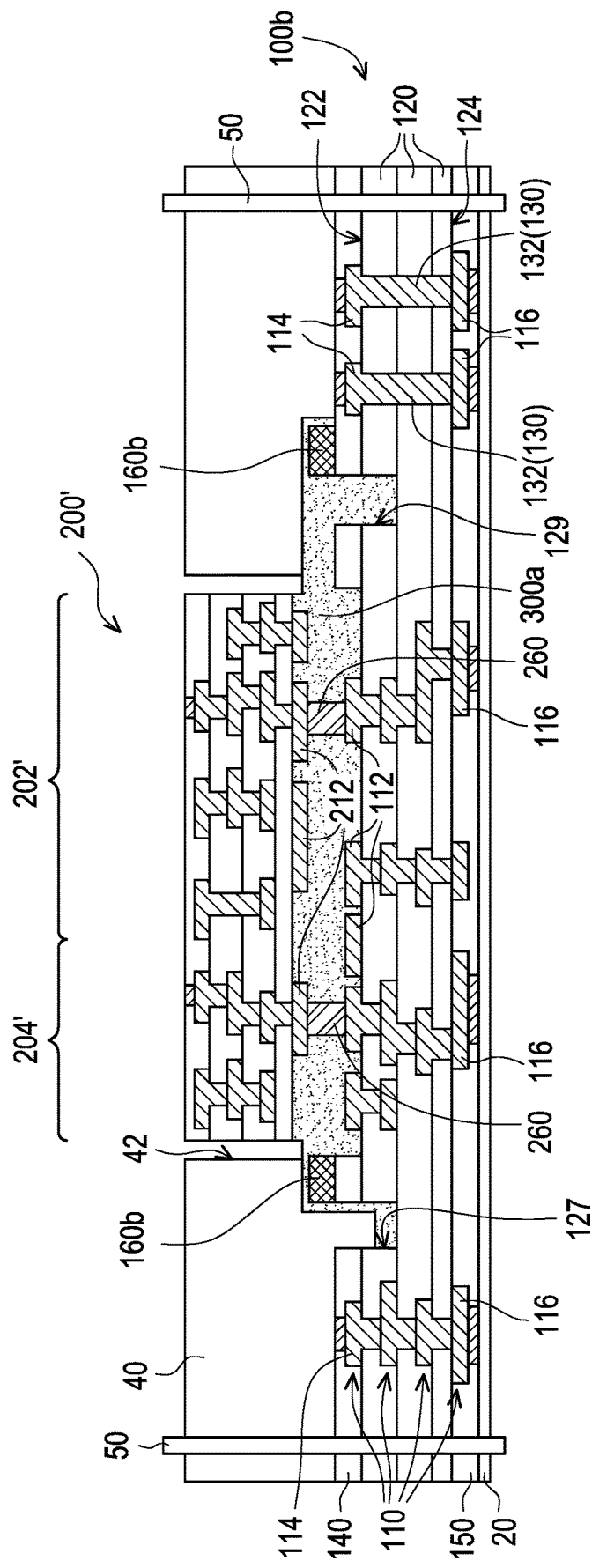

Thereafter, referring to FIG. 2G, the second printed circuit board 200' is thermally press-bonded to the first printed circuit board 100b. The filling glue layer 300a relatively close to the second density circuit area 204' is filled into the first overflow groove 127 along the retaining wall 160b. The filling glue layer 300a relatively close to the first density circuit area 202' is blocked by the retaining wall 160b to fill the second overflow groove 129. At this time, the filling glue layer 300a is filled between the first printed circuit board 100b and the second printed circuit board 200', and covers the first pads 112, the second pads 212, and the conductive pillars 260.

Figure 2H:
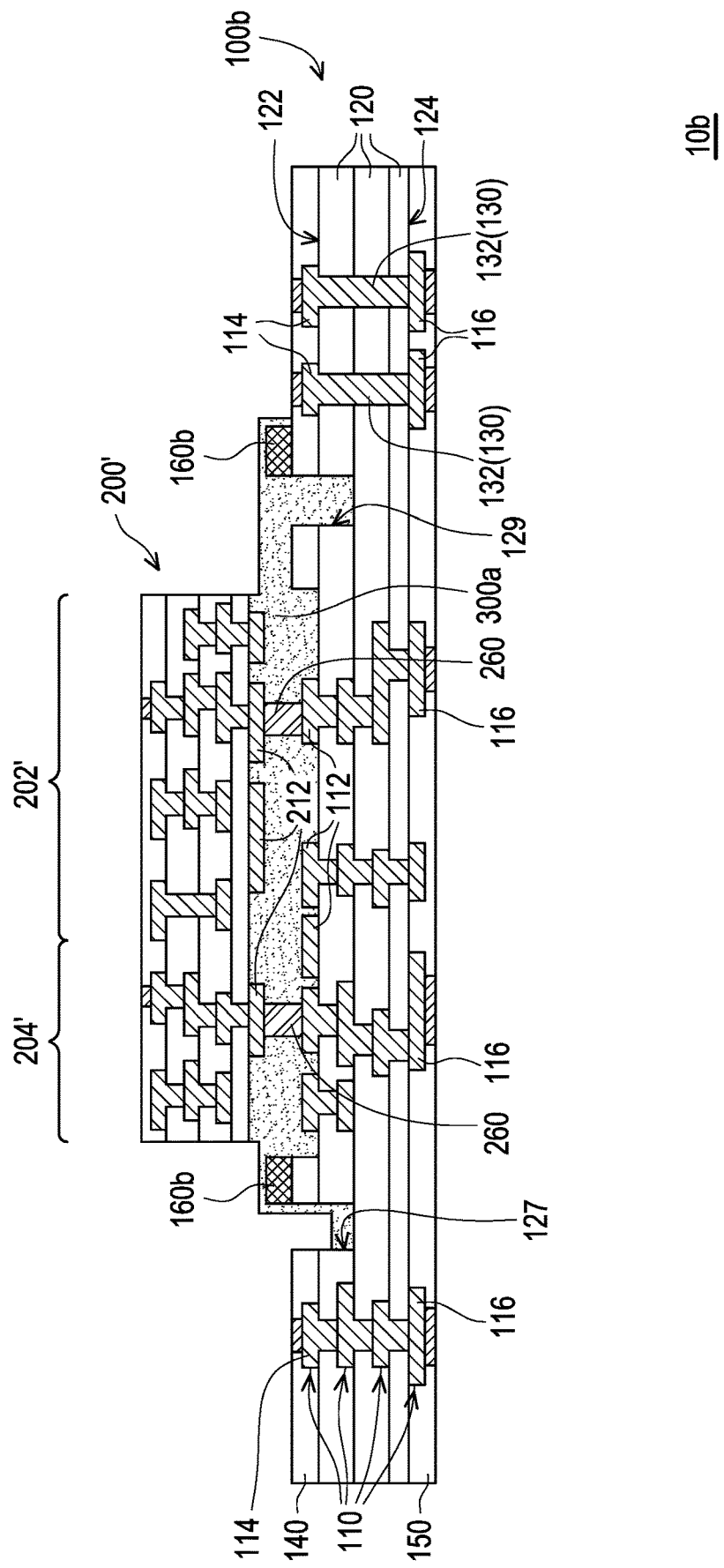

Finally, referring to FIG. 2G and FIG. 2H, the jig 40, the protective layer 20, the fasteners 50, and a portion of the first printed circuit board 100b are removed to complete the fabrication of the printed circuit board stack structure 10b.

In terms of structure, referring to FIG. 1Q and FIG. 2H, the printed circuit board stack structure 10b of this embodiment is similar to the above-mentioned printed circuit board stack structure 10a, and a difference between the two structures lies in that: in this embodiment, the first printed circuit board 100b of the printed circuit board stack structure 10b has only the retaining wall 160b of one height and has the first overflow groove 127 and the second overflow groove 129. In the high-density first density circuit area 202', the flow rate of the molten filling glue layer 300a during the thermal press-bonding is relatively fast and the glue overflows more. By disposing the second overflow groove 129 and the retaining wall 160b behind the second overflow groove 129, the filling glue layer 300a can be prevented from overflowing to the non-bonding area and affecting the electrical properties of the third pads 114. On the other hand, in the low-density second density circuit area 204', the flow rate of the molten filling glue layer 300a during the thermal press-bonding is relatively slow and the glue overflows less. Therefore, the filling glue layer 300a can be prevented from overflowing to the non-bonding area and affecting the electrical properties of the third pads 114 by the retaining wall 160b first. If there is still excess of the filling glue layer 300a overflowing outside the retaining wall 160b, the excess can be filled into the first overflow groove 127 along the retaining wall 160b to avoid overflowing to the non-bonding area and affecting the electrical properties of the third pads 114.

Figure 3:
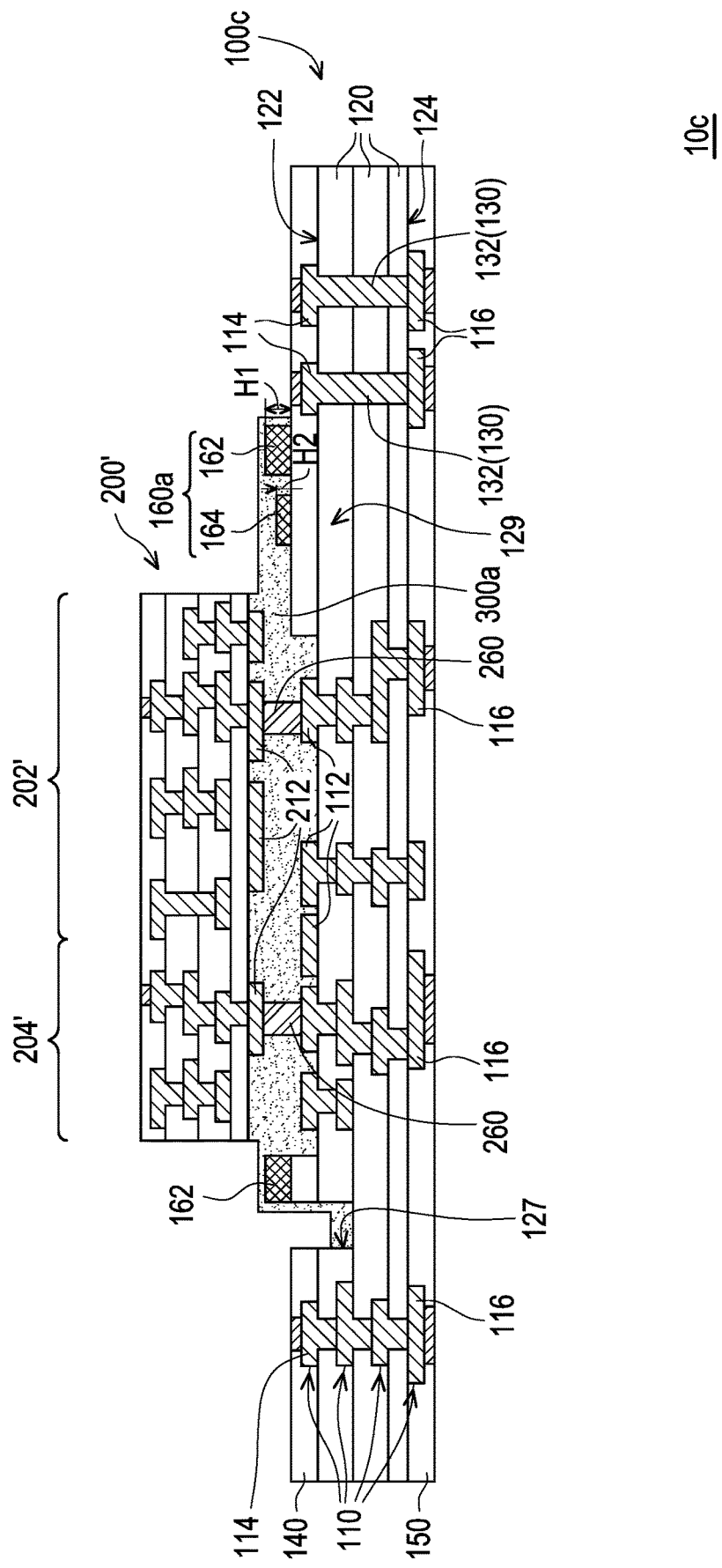
FIG. 3 is a schematic cross-sectional view of a printed circuit board stack structure according to an embodiment of the disclosure.

FIG. 3 is a schematic cross-sectional view of a printed circuit board stack structure according to an embodiment of the disclosure. Referring to FIG. 2 and FIG. 3, the printed circuit board stack structure 10c of this embodiment is similar to the above-mentioned printed circuit board stack structure 10b, and a difference between the two structures lies in that: in this embodiment, only one overflow groove 127 is formed, and the retaining wall 160a includes the first retaining wall 162 and the second retaining wall 164. The first height H1 of the first retaining wall 162 is greater than the second height H2 of the second retaining wall 164.

In detail, the overflow groove 127 is adjacent to the first retaining wall 162 and is located outside the first retaining wall 162. The second density circuit area 204' is relatively close to the overflow groove 127, and the first density circuit area 202' is relatively close to the second retaining wall 164. The filling glue layer 300a relatively close to the second density circuit area 204' is filled into the overflow groove 127 along the first retaining wall 162. The filling glue layer 300a relatively close to the first density circuit area 204' is blocked by the second retaining wall 164 and the first retaining wall 162 and is located inside the first retaining wall 162. That is, in the high-density first density circuit area 202', the flow rate of the molten filling glue layer 300a during the thermal press-bonding is relatively fast and the glue overflows more. By disposing the second retaining wall 164 and the first retaining wall 162 behind the second retaining wall 164, the filling glue layer 300a is prevented from overflowing to the non-bonding area and affecting the electrical properties of the third pads 114. On the other hand, in the low-density second density circuit area 204', the flow rate of the molten filling glue layer 300a during the thermal press-bonding is relatively slow and the glue overflows less. Therefore, the filling glue layer 300a can be prevented from overflowing to the non-bonding area and affecting the electrical properties of the third pads 114 by the first retaining wall 162 first. If there is still excess of the filling glue layer 300a overflowing outside the first retaining wall 162, the excess can be filled into the overflow groove 127 along the first retaining wall 162 to avoid overflowing to the non-bonding area and affecting the electrical properties of the third pads 114.

To sum up, in the design of the printed circuit board stack structure of the disclosure, the surface of the first printed circuit board has the overflow groove and includes the retaining wall surrounding the first pads. Therefore, when the second printed circuit board is connected to the first printed circuit board, the filling glue layer located between the first printed circuit board and the second printed circuit board is blocked by the retaining wall so that a portion of the filling glue layer is accommodated in the overflow groove and does not overflow to the non-bonding area. Accordingly, the printed circuit board stack structure of the disclosure has improved electrical reliability. In addition, the manufacturing method of the printed circuit board stack structure of the disclosure does not require a glue blocking material, which eliminates the problem of glue residues, effectively reduces the cost, and improves the yield.

Although the disclosure has been described with reference to the above embodiments, they are not intended to limit the disclosure. Those having ordinary knowledge in the art can make various changes and modifications without departing from the spirit and scope of the disclosure. Therefore, the scope of the disclosure shall be defined by the claims.

What is claimed is:

1. A printed circuit board stack structure, comprising:
a first printed circuit board having a first surface and a second surface opposite to each other and at least one overflow groove extending from the first surface toward the second surface, and comprising a plurality of first pads located on the first surface and a retaining wall surrounding the first pads;
a second printed circuit board disposed on the first printed circuit board, and comprising a plurality of second pads and a plurality of conductive pillars located on some of the second pads, wherein the conductive pillars are respectively connected to some of the first pads so that the second printed circuit board is electrically connected to the first printed circuit board; and
a filling glue layer filled between the first printed circuit board and the second printed circuit board and covering the first pads, the second pads, and the conductive pillars, wherein the retaining wall blocks the filling glue layer so that a portion of the filling glue layer is accommodated in the at least one overflow groove;
wherein a size of the first printed circuit board is larger than a size of the second printed circuit board, the second printed circuit board has a first density circuit area and a second density circuit area, and a wiring density in the first density circuit area is greater than a wiring density in the second density circuit area; and
wherein the at least one overflow groove is one overflow groove, the retaining wall comprises a first retaining wall and a second retaining wall, a first height of the first retaining wall is greater than a second height of the second retaining wall, the first retaining wall surrounds the first pads, the second retaining wall, and the overflow groove, the first density circuit area is relatively close to the overflow groove and the second density circuit area is relatively close to the second retaining wall, and the overflow groove, the first retaining wall, and the second retaining wall restrict the filling glue layer so that the filling glue layer is located inside the first retaining wall.

2. The printed circuit board stack structure according to claim 1, wherein the first printed circuit board further comprises a plurality of third pads, a plurality of fourth pads, and a plurality of conductive members,
the third pads are located on the first surface and surround the retaining wall,
the fourth pads are located on the second surface, and
the third pads are electrically connected to the fourth pads through the conductive members.

3. The printed circuit board stack structure according to claim 2, wherein the first printed circuit board further comprises a first solder resist layer, a second solder resist layer, a first surface treatment layer, and a second surface treatment layer,
the first solder resist layer is located on the first surface and has a plurality of first solder resist openings,
the first solder resist openings expose the first pads and some of the third pads,
the second solder resist layer is located on the second surface and has a plurality of second solder resist openings,
the second solder resist openings expose some of the fourth pads,
the first surface treatment layer is located on the fourth pads exposed by the second solder resist openings, and
the second surface treatment layer is located on the third pads exposed by the first solder resist openings.

4. The printed circuit board stack structure according to claim 3, wherein the retaining wall is located on the first solder resist layer, and
a material of the retaining wall is the same as a material of the first solder resist layer.

5. The printed circuit board stack structure according to claim 1, wherein the second printed circuit board has a third surface and a fourth surface opposite to each other, and comprises a plurality of fifth pads and a plurality of conductive members,
the second pads are located on the third surface,
the fifth pads are located on the fourth surface, and
the second pads are electrically connected to the fifth pads through the conductive members.

6. The printed circuit board stack structure according to claim 5, wherein the second printed circuit board further comprises a solder resist layer and a surface treatment layer,
the solder resist layer is located on the fourth surface and has a plurality of solder resist openings,
the solder resist openings expose some of the fifth pads, and
the surface treatment layer is located on the fifth pads exposed by the solder resist openings.

* * * * *